United States Patent
Hirotsu et al.

(10) Patent No.: US 7,465,670 B2
(45) Date of Patent: Dec. 16, 2008

(54) PLASMA ETCHING METHOD, PLASMA ETCHING APPARATUS, CONTROL PROGRAM AND COMPUTER STORAGE MEDIUM WITH ENHANCED SELECTIVITY

(75) Inventors: Shin Hirotsu, Nirasaki (JP); Shuhei Ogawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/390,248

(22) Filed: Mar. 28, 2006

(65) Prior Publication Data

US 2006/0213866 A1 Sep. 28, 2006

Related U.S. Application Data

(60) Provisional application No. 60/666,714, filed on Mar. 31, 2005.

(30) Foreign Application Priority Data

Mar. 28, 2005 (JP) ............................. 2005-092575

(51) Int. Cl.
*H01L 21/302* (2006.01)
(52) U.S. Cl. .................. 438/706; 438/723; 438/725
(58) Field of Classification Search ................ 438/706, 438/710, 714, 723, 724, 725; 216/58, 63
See application file for complete search history.

(56) References Cited

U.S. PATENT DOCUMENTS 6,194,128 B1 * 2/2001 Tao et al. ..................... 430/313
6,207,554 B1 * 3/2001 Xu et al. ...................... 438/624
6,607,675 B1 * 8/2003 Hsieh et al. .................... 216/67
6,632,746 B2 * 10/2003 Kanegae et al. .............. 438/706
6,635,185 B2 * 10/2003 Demmin et al. ............... 216/64
6,670,278 B2 * 12/2003 Li et al. ........................ 438/710
6,787,446 B2 * 9/2004 Enomoto et al. ............. 438/623
2004/0106297 A1   6/2004 Kanegae et al.
2004/0157460 A1 * 8/2004 Tanaka et al. ................ 438/710
2005/0014667 A1 * 1/2005 Aoyama et al. .............. 510/175
2005/0221599 A1   10/2005 Lanegae et al.

FOREIGN PATENT DOCUMENTS

JP   2001-210627   8/2001
JP   2003-209037   7/2003

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

On a surface of a semiconductor wafer W, a SiCN film, a SiCOH film, a TEOS film, an antireflection film, and a resist film (ArF resist) as a mask are formed in turn. A via hole is formed by plasma etching the SiCOH film with a predetermined etching gas comprising a mixed gas, for example, $CF_4/CH_2F_2/N_2/O_2$ mixed gas (not containing a rare gas such as an Ar gas). Thereby, the selection ratio between a low dielectric constant insulation film comprising a carbon containing silicon oxide and the resist can be improved. And at the same time, even when the hole has a minute diameter and a high aspect ratio, an inner wall surface of the hole can be formed in a satisfactory state.

12 Claims, 2 Drawing Sheets

PLASMA ETCHING METHOD, PLASMA ETCHING APPARATUS, CONTROL PROGRAM AND COMPUTER STORAGE MEDIUM WITH ENHANCED SELECTIVITY

CROSS-REFERENCE TO RELATED APPLICATION

This application is based upon and claims the benefit of priority from the prior Japanese Patent Application No. 2005-092575, filed on Mar. 28, 2005; and the prior U.S. Patent Provisional Application No. 60/666,714, filed on Mar. 31, 2005; the entire contents of which are incorporated herein by reference.

BACKGROUND OF THE INVENTION

1. Field of the Invention

The present invention relates to a plasma etching method, a plasma etching apparatus, a control program, and a computer storage medium for forming a hole and the like in a low dielectric constant insulation film formed of a carbon containing silicon oxide film by a plasma of an etching gas.

2. Description of the Related Art

Recently, in a manufacturing process of a semiconductor device, instead of a $SiO_2$ film as an insulating film, a low dielectric constant insulation film (Low-K film) formed of a carbon-containing silicon oxide film (a SiCOH film) has been used.

As a plasma etching method for forming a hole in the low dielectric constant insulation film formed of a carbon-containing silicon oxide film as mentioned above, for example, a method using an etching gas containing a mixed gas of $C_4F_8/CH_2F_2/Ar/CO/N_2$ is known (for example, refer to Japanese Patent Laid-open Application No. 2001-210627).

Further, as anther plasma etching method for forming a hole in the low dielectric constant insulation film formed of a carbon-containing silicon oxide film as mentioned above, a method comprising a main etching using an etching gas consisting of a mixed gas of $CH_3/N_2/Ar$, and further over-etching using an etching gas consisting of a mixed gas of $C_4F_6/N_2/Ar$ is known (for example, refer to Japanese Patent Laid-open Application No. 2003-209037).

Incidentally, accompanying with miniaturization of a semiconductor device, diameters of a contact hole, a via hole and the likes have a tendency to be smaller and aspect ratios thereof have also a tendency to be increased. For example, it is required to have a hole diameter of 150 nm or less and an aspect ratio of 3 or more. To cope with the above requirements, as a photo resist for forming a mask at the etching, an ArF resist which uses an ArF excimer laser (wave length 193 nm) as an exposure light source has been used.

However, as a result of extensive studies, the inventor has found that when the low dielectric constant insulation film of the carbon-containing silicon oxide film is etched by using the ArF resist and the etching gas mentioned above, the selection ratio of resist is lowered, many vertical lines are formed in the inner wall of the hole, and a problem that the surface of inner wall is roughened is occurred.

SUMMARY OF THE INVENTION

An object of the present invention is to provide a plasma etching method, a plasma etching apparatus, a control program and a computer storage medium which enable to form an inner wall surface having an excellent smooth surface while improving the selection ratio between a low dielectric constant insulation film and a resist, even when a hole has a minute diameter and a high aspect ratio.

One embodiment of the plasma etching method of the present invention is a plasma etching method for forming a hole in a low dielectric constant insulation film formed of a carbon-containing silicon oxide film by etching with a plasma of an etching gas, wherein the etching gas is a mixed gas containing a fluorocarbon gas and not containing a rare gas.

Another embodiment of the plasma etching method of the present invention is a plasma etching method for forming a hole in a low dielectric constant insulation film formed of a carbon-containing silicon oxide film by etching with a plasma of an etching gas, wherein the etching gas is a mixed gas containing a fluorocarbon gas and not containing an Ar gas.

Further, in the plasma etching method of the present invention mentioned above, the carbon-containing silicon oxide film is a SiCOH film.

Further, in the plasma etching method of the present invention mentioned above, the hole has a diameter of 150 nm or less, and an aspect ratio of 3 or more.

Further, in the plasma etching method of the present invention mentioned above, the etching gas contains a hydrofluorocarbon gas.

Further, in the plasma etching method of the present invention mentioned above, the etching gas is a mixed gas of a fluorocarbon gas, a hydrofluorocarbon gas, an oxygen gas and a nitrogen gas.

Further, in the plasma etching method of the present invention mentioned above, an amount of an oxygen in the etching gas is 2 to 8% in the flowing ratio to the total etching gas.

Further, in the plasma etching method of the present invention mentioned above, an amount of a oxygen gas in the etching gas is 3 to 6% in a flowing ratio to the total etching gas.

Further, in the plasma etching method of the present invention mentioned above, the etching gas further contains a CO gas.

Further, in the plasma etching method of the present invention mentioned above, the resist film is a film which was exposed to a short wavelength light having a wavelength not more than a wavelength of an ArF excimer laser.

Furthermore, a method of the present invention is a plasma etching method for etching a low dielectric constant insulation film formed of a carbon-containing silicon oxide film with a plasma of an etching gas using a mask of a resist film exposed with a short wavelength light having a wavelength not more than that of an ArF excimer laser, wherein said etching gas is a mixed gas containing a fluorocarbon gas, a hydrofluorocarbon gas, an oxygen gas and a nitrogen gas and not containing a rare gas.

A plasma etching method for etching a low dielectric constant insulation film comprising a carbon containing silicon oxide film by a plasma of an etching gas using a mask of a resist film exposed with a short wavelength light having a wavelength not more than that of an ArF excimer laser, wherein the etching gas is a mixed gas containing a fluorocarbon gas, a hydrofluorocarbon gas, an oxygen gas and a nitrogen gas and not containing an Ar gas.

In the plasma etching method of the present invention mentioned above, the carbon-containing silicon oxide film is a SiCOH film.

Further, in the plasma etching method of the present invention mentioned above, an amount of an oxygen in the etching gas is 2 to 8% in the flowing ratio to the total etching gas.

Further, in the plasma etching method of the present invention mentioned above, an amount of an oxygen in the etching gas is 3 to 6% in the flowing ratio to the total etching gas.

Further, in the plasma etching method of the present invention mentioned above, the etching gas further contains a CO gas.

A plasma etching apparatus of the present invention comprises a processing vessel for receiving an object to be treated, means for supplying an etching gas into the processing vessel, means for generating a plasma of the supplied etching gas to plasma-etch the object to be treated, and a control unit to carry out the plasma etching according to any one of the plasma etching methods mentioned above.

A control program of the present invention is a control program which is operated on a computer, the control program controlling a plasma processing apparatus such that any one of plasma etching methods mentioned above is carried out at the time of execution.

A storage medium of the present invention is a computer storage medium in which a control program that is operated on a computer is memorized, the control program controlling a plasma processing apparatus such that any one of plasma etching methods mentioned above is carried out at the time of execution.

DESCRIPTION OF THE EMBODIMENTS

Figure 1A:
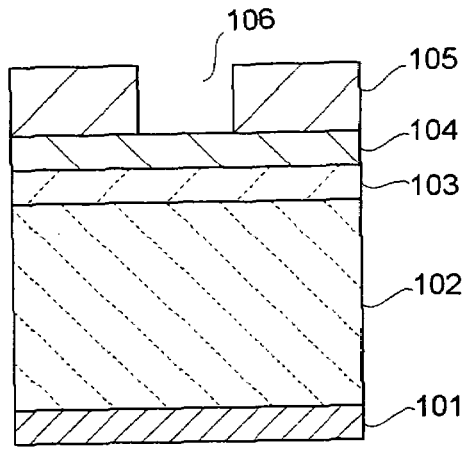
FIGS. 1A, 1B and 1C show a cross sectional view of a semiconductor wafer according to an embodiment of an etching method of the present invention.
Figure 1B:
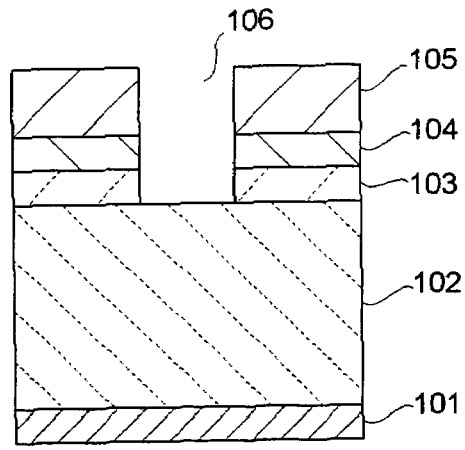
Figure 1C:
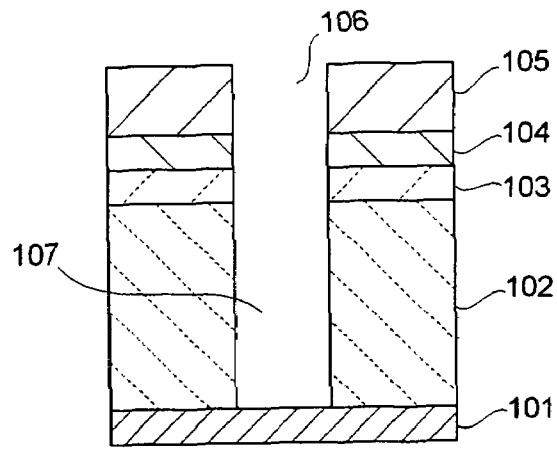
Figure 2:
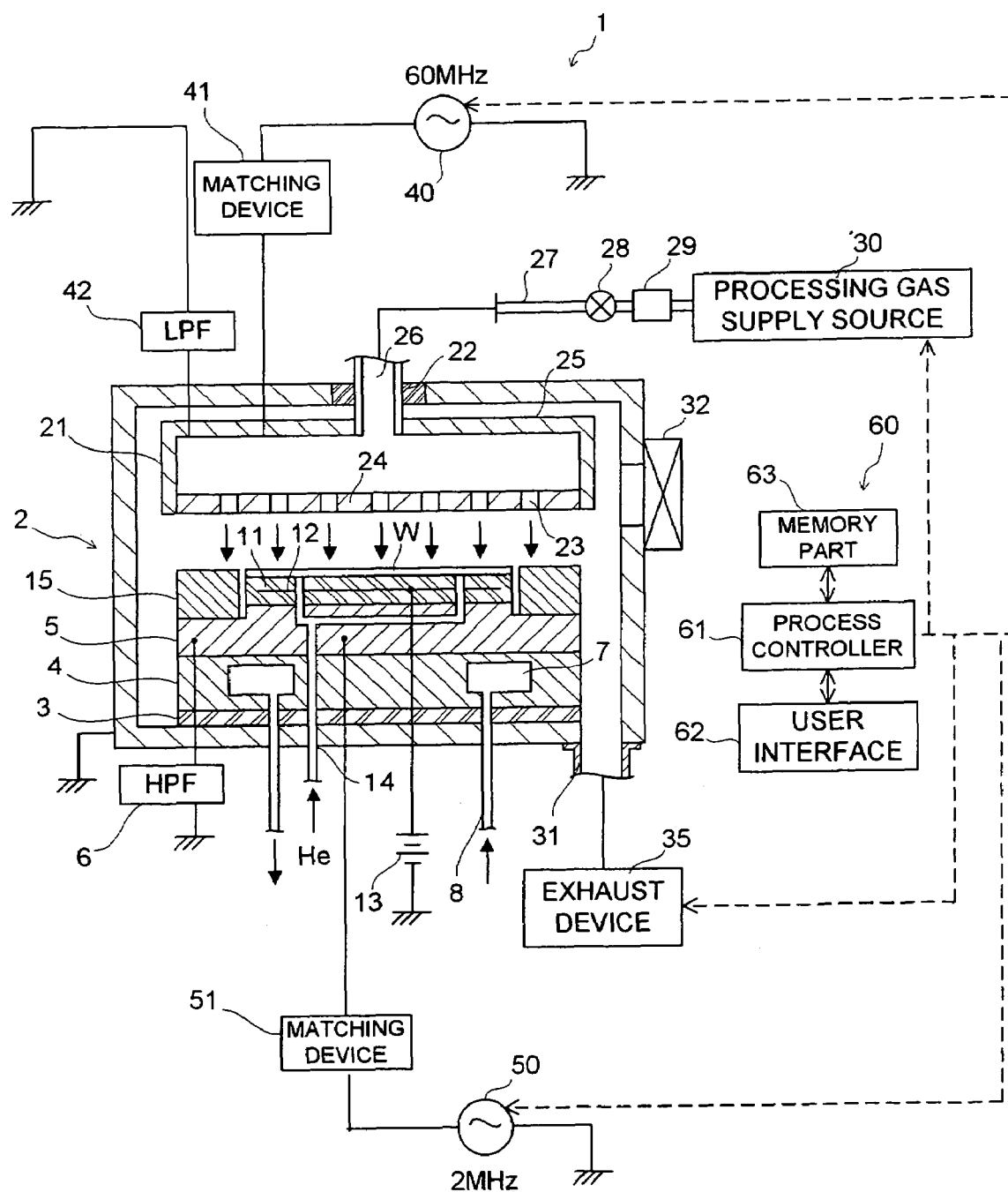
FIG. 2 is a view showing an outline of a structure of an etching apparatus according to an embodiment of the present invention.

Hereinafter, an embodiment of the present invention will be explained with reference to the drawings. FIGS. 1A, 1B and 1C are enlarged cross sectional views showing a structure of a semiconductor wafer W according to an embodiment of the present invention. FIG. 2 is a view showing a structure of a plasma etching apparatus according to an embodiment of the present invention. First, we will describe the structure of the plasma etching apparatus with reference to FIG. 2.

A plasma etching apparatus 1 is a capacity coupling type parallel flat plate etching apparatus in which electrodes are disposed in parallel and up and down to face each other, and one of the electrodes is connected to a power source for forming plasma.

The plasma etching apparatus 1 has a chamber (processing chamber) 2 which is formed in a cylindrical shape and is constituted of an aluminum and the like on which yttria is thermal sprayed, wherein the chamber 2 is grounded. At the bottom portion in the chamber 2, a susceptor support 4 through an insulation plate 3 such as a ceramic plate is disposed. Further on the susceptor support 4, a susceptor 5 which constitutes a lower electrode is provided. To the susceptor 5, a high pass filter (HPF) 6 is connected.

Inside of the susceptor support 4, a refrigerant room 7 is provided. A refrigerant is introduced into the refrigerant room 7 through a refrigerant introducing pipe 8 and circulated therein, and the cold is transferred to the semiconductor wafer W through the susceptor 5. Thereby, a temperature of the semiconductor wafer W can be controlled to a desired temperature.

The susceptor 5 is formed in a circular plate shape having a protrusion portion at a center portion of an upper surface, and an electrostatic chuck 11 having substantially the same shape as the wafer W is provided thereon. The electrostatic chuck 11 is constructed to dispose an electrode 12 between the insulating materials. Then, by applying D.C. voltage such as 1.5 kv from the DC power source 13 connected to the electrode 12, the semiconductor wafer W is electrostatic-absorbed, for example, due to the Coulomb force.

In the insulation plate 3, the susceptor supporter 4, the susceptor 5, and the electrostatic chuck 11, a gas passage 14 for supplying a heat transfer medium (such as a He gas and the like) to the rear surface of the semiconductor wafer W is formed. Through the heat transfer medium, the cold of the susceptor 5 is transferred to the semiconductor wafer W heat, thereby a temperature of the semiconductor wafer W is maintained at a predetermined temperature.

On an upper peripheral portion of the susceptor 5, a ring shaped focus ring 15 is disposed to surround the semiconductor wafer W mounted on the electrostatic chuck 11. The focus ring 15 is formed of a conductive material such as a silicon material, and the conductive material has a function to improve a uniformity of etching.

Over the susceptor 5, an upper electrode 21 is provided in parallel with the susceptor 5 to face to each other. The upper electrode 21 is supported at the upper portion of the chamber 2 through the insulation material 22. The upper electrode 21 is constructed to be an opposite face to the susceptor 5. The upper electrode 21 is constituted of an electrode plate 24 having many discharge holes, and for example, formed of an aluminum having a surface subjected to an anodic oxidation treatment (alumite treatment), and a silica cover provided thereon, and an electrode supporter 25 formed of a conductive material for supporting the electrode plate 24. A distance between the suceptor 5 and the upper electrode 21 is provided so as to enable the change of the distance.

At the center of the electrode supporter 25 of the upper electrode 21, a gas inlet 26 is provided and connected to the gas supply pipe 27. Further, the gas supply pipe 27 is connected to a processing gas supply source 30 through a valve 28 and amass-flow controller 29. From the processing gas supply source 30, an etching gas for plasma etching is supplied. In the present embodiment, from the processing gas supply source 30, for example, an etching gas containing $CF_4/CH_2F_2/N_2/O_2$, an etching gas containing $C_4F_6/CH_3F/N_2/O_2$, an etching gas containing $C_4F_8/CH_3F/N_2/O_2$, an etching gas containing $C_4F_8/CH_2F_2/N_2/O_2$, or an etching gas further containing CO to the above etching gas is supplied.

At the bottom portion of the chamber 2, an exhaust pipe 31 is connected, and an exhaust device 35 is further connected to the exhaust pipe 31. The exhaust device 35 has a vacuum pump such as a turbo-molecular pump, and it is possible to evacuate the inside of the chamber 2 to a predetermined vacuum atmosphere, such as to the predetermined pressure of 1 Pa or less. At the side wall of the chamber 2, a gate valve 32 is disposed, the semiconductor wafer W is carried between the chamber 2 and an adjacent load rock room (not shown), in a state of open of the gate valve 32.

To the upper electrode 21, a first high frequency power source 40 is connected, and a matching device 41 is interposed in a feeding line thereof. Further, to the upper electrode 21, a low pass filter (LPF) is connected. The first high frequency power source 40 has a frequency in a range of 50 to 150 MHz. By applying such high frequency, a plasma having a desired dissociated state and high density can be formed. The frequency of the first high frequency power source 40 is preferably in a range of 50 to 80 MHz. In Examples 1 to 6 mentioned later, 60 MHz as shown in FIG. 2 is used.

To the susceptor 5 as the low electrode, a second high frequency power source 50 is connected and a matching device 51 is interposed in a feeding line thereof. The second high frequency power source 50 has a lower frequency range than that of the first frequency power source 40. By applying such a frequency in a lower range, it is possible to provide a proper ionic action to the semiconductor wafer W to be treated without damaging. A frequency of the second high frequency power source 50 is preferably in a range of 1 to 20 MHz, and in Examples 1 to 6 mentioned later 2 MHz shown in FIG. 2 is used.

In the plasma etching apparatus 1 having a structure mentioned above, the operation thereof is wholly controlled with a control unit 60. The control unit 60 has a process controller 61, which has a CPU and controls each part of the plasma etching apparatus 1, a user interface 62 and a memory part 63.

The user interface 62 is constituted of a key board of which a process manager executes an input operation of command to manage the plasma etching apparatus 1, a display for displaying the state of operation to be visible, and the like.

In the memory part 63, control programs (soft ware) for realizing various kind of processes which are executed in the plasma etching apparatus 1 by controlling of the process controller 61 and recipes in which processing conditions and the like are memorized are stored. And as need arises, by accessing any recipe in the memory part 63 according to the instruction and the like from the user interface 62 and by operating the process controller 61, required processes in the plasma etching apparatus are executed under the control of the process controller 61. And, as the processing program and recipes of data of processing conditions and the like, it is possible to use those stored in the storage medium for computer (for example, hard disk, CD, flexible disk, semiconductor memory and the like), which can be read with a computer, or to use with on-line system those obtained by transmitting from other apparatus at any time through a private line.

When the low dielectric constant insulation film of carbon containing silicon oxide film (SiCOH film) which was formed on the semiconductor wafer W is etched using the plasma etching apparatus 1 having the structure described above, first, after the gate valve 32 is opened, the semiconductor wafer W is conveyed into the chamber 2 from the load rock room (not shown) and mounted on the electrostatic chuck 11. Next, by applying DC voltage from the high voltage DC source, the semiconductor wafer W is electrostatic-absorbed on the electrostatic chuck 11. Next, the gate valve 32 is closed, and then the inside of the chamber 2 is evacuated to the predetermined vacuum using an exhausting apparatus 35.

Thereafter, the valve 28 is opened, a predetermined etching gas is introduced from the processing gas supply source 30 into a hollow portion of the upper electrode 21 through a processing gas supply pipe 27 and a gas introducing inlet 26 while controlling the flow rate by the mass-flow controller 29, and then the processing gas is uniformly discharged to the semiconductor wafer W through discharge holes 23 of the electrode plate 24, as shown by the arrow in FIG. 2.

Then, a pressure in the inside of the chamber 2 is maintained to a predetermined pressure. Thereafter, a high frequency power having a predetermined frequency is applied to the upper electrode 21 from the first high frequency power source 40. Thereby, a high frequency electric field is generated between the upper electrode 21 and the susceptor 5 as the lower electrode and then the etching gas is dissociated and plasmatized.

On the other hand, from the second high frequency power source 50, a high frequency power having a frequency lower than that of the first high frequency power source 40 is applied to the susceptor 5 which is a lower electrode. Thereby, ions in the plasma are drawn into the susceptor 5 side, an anisotropy of etching is enhanced by ion-assist.

Then, when the predetermined etching processing is finished, the supply of the high frequency power and the etching gas is stopped, the semiconductor wafer W is conveyed from the inside of the chamber 2, with a process opposite to the process described above.

Next, we will describe a plasma etching method according to the present invention, with reference to FIGS. 1A, 1B, and 1C. As shown in FIG. 1A, on a surface of the semiconductor wafer W as an object to be treated, a SiCN film 101, a SiCOH film 102, a TEOS film 103, an antireflection film (BARC (SiON)) 104, and a resist film 105 as a mask are formed in turn from the lower side. And the resist film (ArF resist film) 105 has an opening 106 for forming a via-hole having a predetermined diameter. The opening 106 is formed by exposing to a light having a short wavelength of 193 nm or less using a light source of ArF excimer laser, and by developing them. However, such structure mentioned above is only an example. The TEOS film 103 and antireflection film (BARC (SiON)) 104 are allowed to exclude from the structure.

In the plasma etching method of the present embodiment, from the state shown in FIG. 1A, the reflection film 104 and the TEOS film 103 are etched by plasma etching using a predetermined etching gas such as a mixed gas of $CF_4/C_4F_8$ and the like and a mask of the resist film 105, to be a state shown in FIG. 1B.

Next, from the state shown in FIG. 1B, the SiCOH film 102 is etched by plasma etching using a predetermined etching gas of a mixed gas which contains fluorocarbon gas and does not contain a rare gas such as Ar gas, for example, $CF_4/CH_2F_2/O_2$, $C_4F_6/CH_3F/N_2/O_2$, $C_4F_6/CH_3F/N_2/O_2$, $C_4F_8/CH_2F_2/N_2/O_2$, or the like, to form a via hole 107 as shown in FIG. 1C. The via hole 107 has, for example, a diameter of 150 nm or less and an aspect ratio of 3 or more.

When a hole such as a via hole is formed, an etching gas containing a rare gas such as an Ar gas was conventionally used in order to enhance the anisotropy of etching. In contrast, in the present embodiment, an etching gas of a mixed gas containing fluorocarbon gases as mentioned above and not containing a rare gas is used.

Thereby, a selection ratio between the SiCOH film 102 and the resist film 105 (etching rate of SiCOH/etching rate of resist) can be improved compared with the case using the etching gas containing the rare gas such as the Ar gas. Further, it is possible to suppress the forming of vertical lines in the via hole 107. Consequently, even if the hole has a minute diameter or a high aspect ratio, it is possible to obtain the hole having a good inner wall-surface of which the surface roughening of inner wall is suppressed.

In the etching mentioned above, a flow rate of oxygen in total flow rate (flow rate of oxygen (sccm)/flow rate of etching gas (sccm)) is preferably is in a range of 2 to 8%, and more preferably in a range of 3 to 6%. Further, in order to decrease the roughening such as vertical lines in the inner wall of the hole, where necessary, it is desirable to add some amount of CO gas to the etching gas.

EXAMPLE 1

As Example 1, using a plasma etching apparatus shown in FIG. 2, in the semiconductor wafer W (SiCN=50 nm, SiCOH=1000 nm, TEOS=60 nm, and resist=470 nm), as shown in FIG. 1A, a via hole (aspect ratio: about 7) having a opening diameter of 150 nm was formed in the SiCOH film 102 by plasma etching using a mask of resist film 105 (ArF resist film) according to the following conditions.

Further the processing recipe of each example was read from the memory part 63 of the control unit 60 and was inputted into the process controller 61. Base on the control program, respective parts of the plasma etching apparatus 1 were controlled, thereby etching processes were carried out according to the processing recipe which was read-out.

(Etching of Antireflection Film and TEOS Film)

Etching gas: $CF_4/C_4F_8$=200/10 sccm, pressure: 16.0 Pa (120 mTorr), power (upper portion/lower portion): 1000/600 W, temperature (upper portion/side wall portion/lower portion) =60/60/20° C.

(Etching of SiCOH Film)

Etching gas: $CF_4/CH_2F_2/N_2/O_2$=30/20/200/10 sccm, pressure: 9.3 Pa (70 mTorr), power (upper portion/lower portion): 600/1000 W, temperature (upper portion/side wall portion/lower portion)=60/60/20° C.

As the result, the etching rate of SiCOH was 611 nm/min, and the selection ratio to the resist was 11.5. Further, vertical lines in the via hole could not almost be found.

In contrast, as a comparative example, by adding an Ar gas (flow rate of 200 sccm) that is a rare gas to the etching gas described above, the same sample is etched using similar conditions with respect to the other conditions. As the result, the etching rate of SiCOH was 439 nm/min and the selection ratio to the resist was 7.8. Further, many vertical lines were fund in the via hole.

As mentioned above, according to Example 1, it was possible to improve the selection ratio of SiCOH to the resist. Further, the occurrence of vertical lines in the via hole was suppressed, and then even if the via hole had a minute diameter and high aspect ratio, it was possible to form an inner wall surface in a satisfactory state.

EXAMPLE 2

As Example 2, using a plasma etching apparatus shown in FIG. 2, in the semiconductor wafer W (SiCN=40 nm, SiCOH=500 nm, TEOS=60 nm, SiON=80 nm, and resist=300 nm), as shown in FIG. 1A, a via hole (aspect ratio: about 3.3) having a opening diameter of 150 nm was formed in the SiCOH film 102 by plasma etching using a mask of resist film 105 (ArF resist film) according to the following conditions.

(Etching of Antireflection Film and TEOS Film)

Etching gas: CF4=150 sccm, pressure: 20.0 Pa (150 mTorr), power (upper portion/lower portion): 600/600 W, temperature (upper portion/side wall portion/lower portion)=60/60/20° C.

(Etching of SiCOH film)

Etching gas: $C_4F_6/CH_3F/N_2/O_2$=6/40/120/8 sccm, pressure: 9.3 Pa (70 mTorr), power (upper portion/lower portion): 1000/1400 W, temperature (upper portion/side wall portion/lower portion)=60/60/20° C.

As the result, the etching rate of SiCOH was 709 nm/min, and the selection ratio to the resist was 16.3. Further, vertical lines in the via hole could not almost be found.

In contrast, as a comparative example, by adding an Ar gas (flow rate of 200 sccm) that is a rare gas to the etching gas described above, the same sample is etched using similar conditions with respect to the other conditions. As the result, the etching rate of SiCOH was 532 nm/min and the selection ratio to the resist was 10.0. Further, many vertical lines were fund in the via hole.

As mentioned above, according to Example 2 which has a different kind of gas from Example 1, it was possible to improve the selection ratio of SiCOH to the resist. Further, the occurrence of vertical lines in the via hole was suppressed, and then even if the via hole had a minute diameter and high aspect ratio, it was possible to form an inner wall surface in a satisfactory state.

EXAMPLE 3

Example 3 (the flow rate of oxygen: 7.4%) in which the flow rate of oxygen to the total etching gas was increased, using a plasma etching apparatus shown in FIG. 2, in the semiconductor wafer W having no TEOS film in FIG. 1A, (SiCN=50 nm, SiCOH=600 nm, SiON=80 nm, and resist=400 mm), a via hole was formed in the SiCOH film 102 by plasma etching using a mask of resist film 105 (ArF resist film) according to the following conditions.

(Etching of Antireflection Film)

Etching gas: CF4=100 sccm, pressure: 6.6 Pa (50 mTorr), power (upper portion/lower portion): 1000/100 W, temperature (upper portion/side wall portion/lower portion)=60/50/15° C.

(Etching of SiCOH Film)

Etching gas: $C_4F_8/CH_3F/N_2/O_2$=6/30/90/10 sccm, pressure: 9.3 Pa (70 mTorr), power (upper portion/lower portion): 600/1200 W, temperature (upper portion/side wall portion/lower portion)=60/50/15° C.

As the result, the etching rate of SiCOH was 772 nm/min, and the selection ratio to the resist was 27.6. Further, vertical lines in the via hole could not almost be found.

EXAMPLE 4

Further, as Example 4, the flow rate of $CH_3F$ (30 sccm) in the main etching of Example 3 (the flow rate of oxygen: 7.4%) was changed to $CH_2F_2$ (30 sccm) and a via hole was formed with the same conditions as those of Example 3 with respect to the other conditions.

As the result, the etching rate of SiCOH was 672 nm/min, and the selection ratio to the resist was 10.5. Further, vertical lines in the via hole could not almost be found.

EXAMPLE 5

Using the similar gas system as that of Example 1, the flow rate of oxygen to the total etching gas was decreased (flow rate of oxygen: 2.4%), and using the plasma etching apparatus shown in FIG. 2, in the semiconductor wafer W shown in FIG. 1A (SiCN=50 nm, SiCOH=400 nm, TEOS=50 nm, SiON=80 nm, and resist=400 nm), a via hole is formed using a mask as the resist film (ArF resist) 105 according to the following etching conditions.

(Etching of Antireflection Film and TEOS Film)

Etching gas: CF4=200 sccm, pressure: 13.3 Pa (100 mTorr), power (upper portion/lower portion): 300/300 W, temperature (upper portion/side wall portion/lower portion)=60/60/0° C.

(Etching of SiCOH Film)

Etching gas: $CF_4/CH_2F_2/N_2/O_2$=30/25/350/10 sccm, pressure: 6.7 Pa (50 mTorr), power (upper portion/lower portion): 400/1400 W, temperature (upper portion/side wall portion/lower portion)=60/60/0° C.

In the above gas system (the flow rate of oxygen is about 2.4%), the tendency that the etching rate of SiCOH and the selection ratio to the resist were degraded than those of Example 1 was recognized, but we could not almost found vertical lines in the via hole.

As seen from Examples 1 to 5 mentioned above, it is desired that the flow rate of oxygen to the total flow rate of etching gas is about in a range of 2 to 8%, preferably, 3 to 6%.

EXAMPLE 6

As Example 6, using an etching gas including CO which was added to the gas system using in Example 1, a via hole is formed by etching according to the following conditions. The antireflection film and the TEOS film were etched with the same conditions as Example 1.

(Etching of SiCOH Film)

Etching gas: $CF_4/CH_2F_2/N_2/O_2/CO=30/20/200/12/50$ sccm, pressure: 9.3 Pa (70 mTorr), power (upper portion/lower portion): 600/1000 W, temperature (upper portion/side wall portion/lower portion)=60/60/0° C.

As the result, compared with Example 1, the etching rate was little degraded, but the selection ratio was slightly improved and the roughening (vertical lines) of inside wall in the hole was further improved.

As seen from Example 6, to decrease the roughening such as vertical lines, it is desired to add a proper amount of CO to the etching gas as needs.

According to the above Examples, it is possible to improve the selection ratio between the low dielectric constant insulation film comprised of carbon containing silicon oxide film and the resist, and at the same time it is possible to form a hole having a good inner surface even when the hole has a minute diameter and a high aspect ratio.

What is claimed is:

1. A plasma etching method for forming a hole by etching a low dielectric constant insulation film comprising a carbon-containing silicon oxide film using a plasma of an etching gas and a resist film as a mask,
    wherein the etching gas is a mixed gas containing a combination of at least one of $CF_4$ and $C_4F_8$, and $CH_2F_2$ and/or a combination of at least one of $CF_4$ and $C_4F_8$, and $CH_3F$, an oxygen gas in a flow rate of 3.8 to 7.4% to the total etching gas and not containing a rare gas so that a selection etching ratio of said low dielectric constant insulation film for said resist film is 10.5 or more.

2. A plasma etching method for forming a hole by etching a low dielectric constant insulation film comprising a carbon-containing silicon oxide film using a plasma of an etching gas and a resist film as a mask,
    wherein the etching gas is a gas mixture containing a combination of at least one of $CF_4$ and $C_4F_8$, and $CH_2F_2$ and/or a combination of at least one of $CF_4$ and $C_4F_8$, and $CH_3F$, an oxygen gas in a flow rate of 3.8 to 7.4% to the total etching gas and not containing an Ar gas so that a selection etching ratio of said low dielectric constant insulation film for said resist film is 10.5 or more.

3. The plasma etching method according to claim 2, wherein the carbon-containing silicon oxide film is a SiCOH film.

4. The plasma etching method according to claim 2,
    wherein the hole has a diameter of 150 nm or less and an aspect ratio of 3 or more.

5. The plasma etching method according to claim 2, wherein the etching gas contains a hydro-fluorocarbon gas.

6. The plasma etching method according to claim 2,
    wherein the etching gas is the mixed gas containing a fluorocarbon gas, a hydro-fluorocarbon gas, an oxygen gas and a nitrogen gas.

7. The plasma etching method according to claim 6,
    wherein the etching gas further contains a CO gas.

8. The plasma etching method according to claim 2,
    wherein the resist film is a film which was exposed to a short wavelength light having a wavelength not more than a wavelength of an ArF excimer laser.

9. A plasma etching method for etching a low dielectric constant insulation film comprising a carbon containing silicon oxide film by a plasma of an etching gas using a mask of a resist film exposed with a short wavelength light having a wavelength not more than that of an ArF excimer laser,
    wherein the etching gas is a mixed gas containing a combination of at least one of $CF_4$ and $C_4F_8$, and $CH_2F_2$ and/or a combination of at least one of $CF_4$ and $C_4F_8$, and $CH_3F$, a hydrofluorocarbon gas, an oxygen gas in a flow rate of 3.8 to 7.4% to the total etching gas and a nitrogen gas and not containing a rare gas so that a selection etching ratio of said low dielectric constant insulation film for said resist film is 10.5 or more.

10. A plasma etching method for etching a low dielectric constant insulation film comprising a carbon containing silicon oxide film by a plasma of an etching gas using a mask of a resist film exposed with a short wavelength light having a wavelength not more than that of an ArF excimer laser,
    wherein the etching gas is a mixed gas containing a combination of at least one of $CF_4$ and $C_4F_8$, and $CH_2F_2$ and/or a combination of at least one of $CF_4$ and $C_4F_8$, and $CH_3F$, a hydrofluorocarbon gas, an oxygen gas in a flow rate of 3.8 to 7.4% to the total etching gas and a nitrogen gas and not containing an Ar gas so that a selection etching ratio of said low dielectric constant insulation film for said resist film is 10.5 or more.

11. The plasma etching method according to claim 10, wherein the carbon-containing silicon oxide film is a SiCOH film.

12. The plasma etching method according to claim 10, wherein the etching gas further contains a CO gas.

* * * * *